United States Patent [19]

Ward et al.

[11] Patent Number: 5,691,885

[45] Date of Patent: *Nov. 25, 1997

[54] THREE-DIMENSIONAL INTERCONNECT HAVING MODULES WITH VERTICAL TOP AND BOTTOM CONNECTORS

[75] Inventors: Stephen A. Ward, Watertown; Gill A. Pratt, Lexington; John N. Nguyen, Belmont; John S. Pezaris, Winchester; Norman Margolus, Somerville, all of Mass.

[73] Assignee: Massachusetts Institute of Technology, Cambridge, Mass.

[*] Notice: The term of this patent shall not extend beyond the expiration date of Pat. No. 5,568,361.

[21] Appl. No.: 323,382

[22] Filed: Oct. 14, 1994

Related U.S. Application Data

[63] Continuation-in-part of Ser. No. 279,693, Jul. 25, 1994, Pat. No. 5,568,361, which is a continuation of Ser. No. 852,603, Mar. 17, 1992, abandoned.

[51] Int. Cl.⁶ .................... H05K 7/10; H05K 5/00; H01R 29/00
[52] U.S. Cl. .................... 361/735; 361/729; 361/730; 361/733; 439/44
[58] Field of Search .................. 257/686; 273/153 P, 273/160; 310/328, 309, 330, 332; 361/729, 730, 731, 733, 735, 784, 785, 790, 791, 803; 437/51, 209, 915; 439/44, 45, 47, 68, 69, 74, 928; 446/120, 121, 122, 124, 125, 127

[56] References Cited

U.S. PATENT DOCUMENTS

| | | | |
|---|---|---|---|
| 4,423,465 | 12/1983 | Teng-Chin et al. | 361/730 |
| 4,499,607 | 2/1985 | Higgins | 361/735 |
| 4,582,953 | 4/1986 | Nagase et al. | 257/686 |
| 4,727,410 | 2/1988 | Higgins, III | 357/74 |
| 4,733,461 | 3/1988 | Nakano | 29/830 |
| 4,742,552 | 5/1988 | Andrews | 382/41 |
| 4,954,458 | 9/1990 | Reid | 437/51 |
| 4,969,827 | 11/1990 | Hahs, Jr. | 439/68 |
| 4,983,533 | 1/1991 | Go | 437/7 |
| 5,006,920 | 4/1991 | Schafer et al. | 357/74 |
| 5,016,138 | 5/1991 | Woodman | 361/381 |
| 5,051,865 | 9/1991 | Kato | 361/386 |
| 5,568,361 | 10/1996 | Ward et al. | 361/735 |

FOREIGN PATENT DOCUMENTS

| | | |
|---|---|---|
| A-3616821 | 11/1987 | Germany . |
| 61-99361 | 5/1986 | Japan . |
| 61-101067 | 5/1986 | Japan . |
| 61-168951 | 7/1986 | Japan . |
| 1-136360 | 5/1989 | Japan . |
| 0129955 | 5/1990 | Japan . |
| 2-199859 | 8/1990 | Japan . |
| WO 91/19258 | 12/1991 | WIPO . |
| 93/19432 | 9/1993 | WIPO . |

OTHER PUBLICATIONS

Shin, "Harts: A Distributed Real Time Architecture," *IEEE*, pp. 25–35 (May 1991).

Chen, et al., "Addressing, Routing and Broadcasting in Hexagonal Mesh Multiprocessors," *IEEE Trans. on Computers*, 39(1):10–18 (1990).

M.J. Little, et al., "The 3–D Computer," *Journal of VLSI Signal Processing*, 2 (2) (Oct., 1990).

Gaensslen, "Multichip Packaging," *IBM Disclosure Bulletin*, 12(10):1579–1580 (Mar., 1970).

*Primary Examiner*—Donald Sparks
*Attorney, Agent, or Firm*—Hamilton, Brook, Smith & Reynolds, P.C.

[57] ABSTRACT

Circuit supporting modules form a three-dimensional communication interconnect mesh. A first embodiment three-dimensional communication interconnect is a tetrahedral lattice having a regular, isotropic, three-dimensional topology in which each module connects to its four physically closest neighbors. The structure of the tetrahedral interconnect is isomorphic with a diamond lattice structure. In a second embodiment the interconnect is hexahedral. A characteristic of both is embodiments is that, although connections are made to plural other modules, the physical connections are made along the same direction.

37 Claims, 8 Drawing Sheets

Fig. 1

PRIOR ART

THREE-DIMENSIONAL INTERCONNECT HAVING MODULES WITH VERTICAL TOP AND BOTTOM CONNECTORS

RELATED APPLICATIONS

This application is a continuation-in-part of U.S. Ser. No. 08/279,693, filed Jul. 25, 1994, now U.S. Pat. No. 5,568,361, which is a continuation of U.S. Ser. No. 07/852,603, filed Mar. 17, 1992 now abandoned, the entire teachings of which are incorporated herein by reference.

GOVERNMENT SUPPORT

This invention was made with government support under Grant Number N00014-89-J-1988 awarded by the United States Navy. The government has certain rights in the invention.

BACKGROUND OF THE INVENTION

Typically, computers and other electronic processors include interconnected sets of computational modules, each performing a specific task or function. These modules are assembled into a full system by connecting the appropriate wires that lead in and out of each module through a bus. The bus allows various computer chips or boards to communicate and exchange data. This standardized approach has allowed system designers to physically arrange components in any manner they require without worrying about the details of interconnections.

Bus architecture constrains the efficiency of communication among modules. This is a key limitation in today's quest for faster, more efficient computers. Since buses serialize all communications, a bottleneck results. To make matters worse, the total capacity of the intercommunication remains roughly constant as the system size and the demand for the exchange of information increases. Moreover, the time taken by each transaction must accommodate the physical length of the bus, a crucial factor that limits the communication bandwidth in all but the shortest buses. These deficiencies reduce the viability of the bus as a basis for communication in modern computer systems.

To increase the efficiency in communication among modules, modern multiprocessor architectures have been designed with various topologies other than the bus. Such topologies include one-dimensional, two-dimensional and three-dimensional topologies.

SUMMARY OF THE INVENTION

The size of future computer systems mandates the use of three-dimensional topologies for efficient utilization of communication bandwidth and space. For maximum flexibility, these topologies should have incremental expandability, arbitrary scalability, and support fast static and dynamic communication.

The present invention provides a modular and high-performance communications substrate that standardizes the mechanical, electrical, and logical interconnection among modules arranged in a three-dimensional mesh. This mesh is constructed of replicated near-neighbor links, the mechanical and electrical characteristics of which are rigidly constrained and highly optimized. These constraints allow performance parameters for non-local communications that compete favorably with those of the ad-hoc interconnects found in contemporary supercomputers.

In general, according to one aspect, the invention features a three-dimensional electronic circuit assembly. This assembly comprises data processing modules supporting respective circuits. Each module has at least three sets of connectors along fewer than six flat surfaces thereof for joining the circuits on the modules to adjacent modules. Adjacent modules are oriented relative to each other such that adjacent modules interconnect in a three-dimensional lattice of stacked levels.

In general, according to another aspect, the invention features an electronic circuit assembly. This assembly comprises data processing modules in a three-dimensional lattice supporting respective circuits. Each module has at least three possible logical axes of connection. That is, it is adapted to connect to at least three other modules of the lattice. The physical connections to these other modules, however, are made along the same direction. This feature enables a high degree of connectivity while allowing the modules to incorporate simple connectors and be easily connected and reconnected to and from each other.

The modules may take any form including circuit boards, semiconductor chips, actual semiconductor substrate on which integrated circuits have been formed, multichip modules, and housings of any shape. Circuit board modules with top and bottom connectors that are aligned substantially along the same direction are currently contemplated as particularly suited to the assembly.

According to a first embodiment, a possible shape of the three-dimensional lattice is a tetrahedral lattice in which each of the joined modules communicate with four other modules. This embodiment is isomorphic to a diamond lattice and is particularly advantageous in that it is isotropic, although it repeats only every fourth level. Accordingly, each module has connectors for connecting to adjacent modules along four logical axes. Adjacent modules are connected along a single common axis but are rotated relative to each other such that connections from adjacent modules are made in opposite directions.

Alternatively, according to a second embodiment, the lattice can be hexahedral. Here also, the lattice is isotropic repeating every third level, but the connectors connect to adjacent modules along six logical axes of connection. Adjacent modules are physically connected along a single direction as in the hexahedral case.

The assembly may be made from a plurality of flat modules with only vertical interconnections. Accordingly, each flat surface of a module may support plural, like, parallel, extended connector sets. In the first embodiment the connector sets on opposite surfaces of the substrates are complementary to each other and rotated 90° relative to each other. In the second embodiment, the connectors may be rotated 60°.

In both embodiments, each of the modules of any given level only directly connects to exchange data with other modules of a corresponding next higher level and a corresponding next lower level. The module does not connect with other same-level modules. In the first embodiment, each module is adapted to only directly connect with exactly two other modules of the next higher level and two other modules of the of next lower level. In the second embodiment, each module is adapted to only directly connect to exchange data with three other modules the next higher level and three modules of the next lower level.

The substrate of each module may support a plurality of circuit chips, and auxiliary circuit boards may be mounted to the substrates.

Each module is physically identical relative to the connectors, but may be oriented in one of two directions within the lattice. Each module is connected only to modules of the opposite orientation. Each of the two orientations may also be identified with one of two-phases of a two-phase clock, so that no neighboring modules operate on the same clock phase in inter-module communications. Further, the modules may be spaced horizontally within levels of the lattice, thereby allowing paths for coolant flow and space for auxiliary boards. The resultant serpentine flow paths may then ensure turbulent flow as coolant fluid, air or liquid, is directed therethrough.

The first embodiment may be addressed by a four element vector. The vector elements represent four non-orthogonal directions that a particular message being sent from a substrate may travel. The four element addressing system ensures that no two modules are assigned the same address and that no two addresses are assigned the same module.

In general, according to another aspect, the invention features a module adapted to be connected with other modules in a three-dimensional electronic circuit assembly. This module comprises a processor and a platform supporting the processor having a first face and a second face, opposed to said first face. The platform can be a circuit board, the processor being a microprocessor chip on this board, or for example an actual silicon substrate can be implemented, on which a processor is formed. At least two connectors are positioned on each of the first face and the second face. These connectors are adapted for providing communication between the processor and a different module of the assembly.

In both embodiments, the connectors are mutually aligned to connect with corresponding connectors of other modules substantially along the same axis. In the first embodiment, only two connectors are positioned on each of the first and second faces. But, in the second embodiment, three connectors are positioned on each of the first and second faces.

In general, according to another aspect, the invention features a method of providing a three-dimensional electronic circuit assembly. This method comprises providing a plurality of modules for performing data processing operations. The modules are then arranged in a three-dimensional isotropic lattice. This lattice is constructed to have stacked levels. Finally each of the modules in the interior of the lattice of a given level is connected to other modules of a corresponding next higher level and other modules of a corresponding next lower level.

While the present invention will hereinafter be described in connection with a preferred embodiment and method of use, it will be understood that it is not intended to limit the invention to this embodiment. Instead, it is intended to cover all alternatives, modifications, and equivalents as may be included within the spirit and scope of the present invention as defined by the appended claims.

DETAILED DESCRIPTION OF THE INVENTION

Communication networks are characterized by their connectivity. Classification of networks depend on the number of nodes reachable in n time steps from a central node within an infinite network. If the number of reachable nodes grows linearly (e.g., a factor times the number of time steps plus a constant), the network is classified as one-dimensional and designated as O(n). Similarly, if the number of reachable nodes grows quadratically, the network is classified as two-dimensional and designated as $O(n^2)$. Thus, if the number of distinct nodes grows as $n^3$, then the network is classified as three-dimensional and is designated as $O(n^3)$.

Each node in the network is connected to its neighbors through communications ports or connector sets. A node is characterized by the number of ports or the number of neighbors connected to the ports. A node having three ports is considered to be less complex than a node having six ports.

A description of a communications network can be formulated from the connectivity and the number of neighbors. For example, a series of two-port nodes strung together in a one-dimensional topology would be called a 1D-2N network; a collection of four-port nodes connected in a two-dimensional Cartesian mesh would be called a 2D-4N network. For certain combinations, this description is complete (e.g., there is only one 1D-2N network); for others, it is incomplete.

Figure 1:
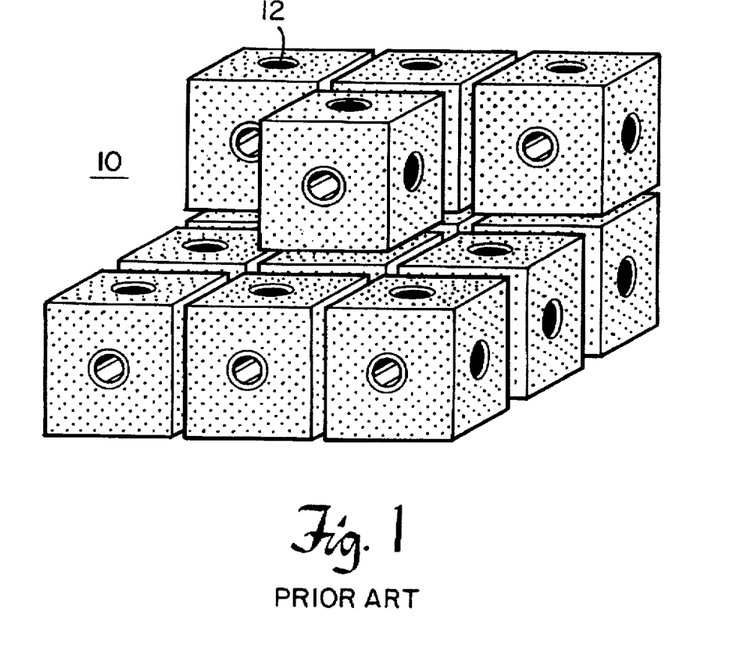
FIG. 1 shows a three-dimensional communication interconnect of the prior art.

A scalable, three-dimensional, 6-neighbor (3D-6N) cubic communication interconnect or mesh 10 is illustrated in FIG. 1. The mesh includes modules, boards, substrates, or nodes, 12 that are connected together to form a three-dimensional mesh. FIG. 1 depicts each module as a cube whose faces provide signal contacts as well as power and coolant to six immediate neighbors.

The present invention is directed toward various topologies that ease the mechanical construction requirements and construction complexity while in some cases lowering node complexity over the mesh shown in FIG. 1 and in other cases matching the logical interconnection of the FIG. 1 mesh 10. The first embodiment topology of the present invention is a 3D-4N network.

Figure 2:
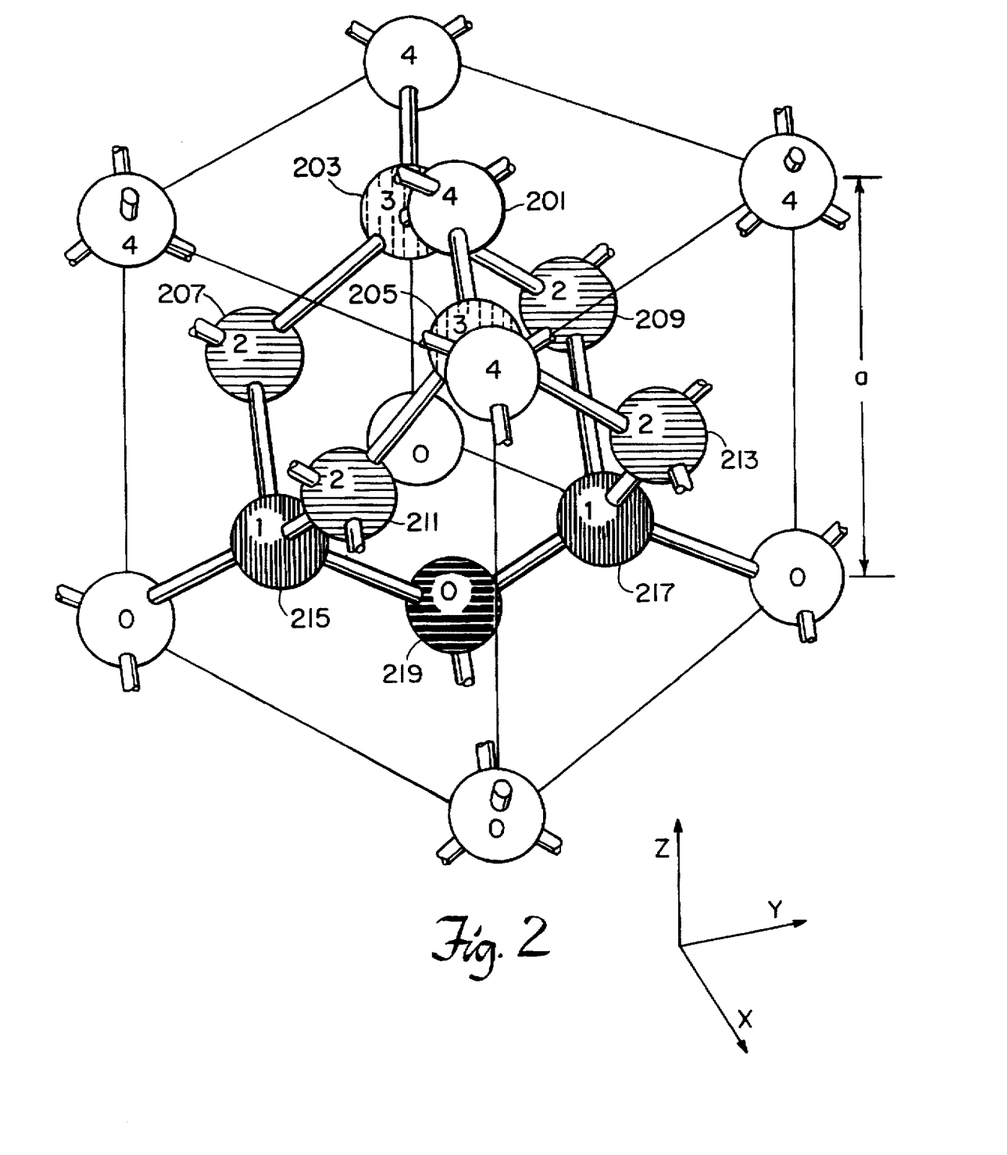
FIG. 2 shows a crystal structure of a diamond lattice to which one embodiment of the present invention is isomorphic.

The inventive 3D-4N network is based upon the crystal structure of a diamond lattice (i.e., crystalline carbon). The diamond lattice is incorporated in the 3D-4N mesh of the present invention and is shown in FIG. 2. In a diamond lattice, each carbon atom has four links or axes of connection with four neighboring atoms. An aggregate of four atoms form a unit cell which, when repeated, constitutes the complete crystalline lattice. In the 3D-4N, circuit supporting modules correspond to the carbon atoms with each being linked to four neighboring modules. We designate each module in the diamond lattice shaped 3D-4N mesh with a numeral (0,1,2,3,4) that is representative of their position level within the mesh. Substrates having a level 0 are positioned at the bottom of the mesh, substrates of level 1 are positioned above level 0 substrates, level 2 substrates are positioned above level 1 substrates, then level 3 is the next highest level, and level 4 occupies the top level. Level 4 can then be labeled level 0 for the next group of the repeated lattice structure. The levels of the mesh are joined together by connecting each substrate's axes to substrates at adjacent levels. For example, each level 0 (4) substrate is linked to the axes of two level 1 and two level 3 substrate. Each level 1 substrate is linked to two level 0 and two level 2 substrate. Each level 2 substrate is linked by its four axes to two level 1 and two level 3 substrates. After linking all of the substrates together, the 3D-4N mesh has the form of a diamond lattice.

Figure 3:
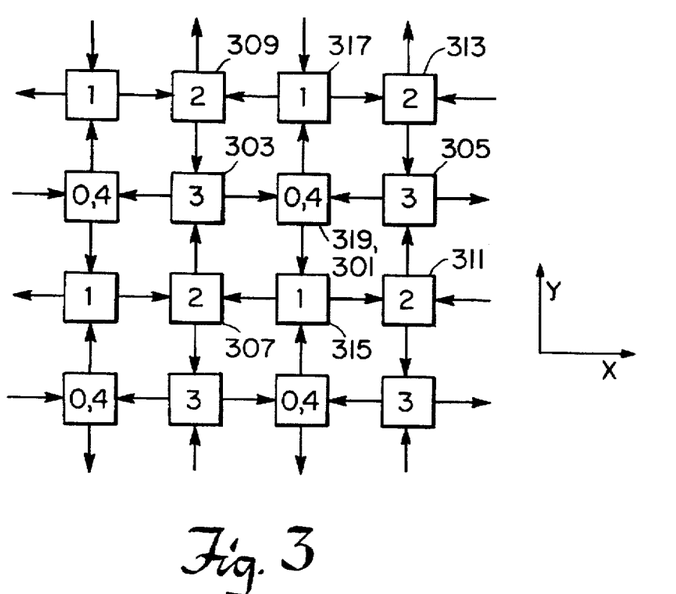
FIG. 3 is a rectilinear array remapping the atoms of the diamond lattice.

This 3D-4N tetrahedral mesh can be further conceptualized by using an orthogonal array of mechanically homogeneous modules or nodes that are remapped by projection onto a plane from the diamond lattice shown in FIG. 2. FIG. 3 shows a rectilinear array of the remapped atoms. The modules 301–319 in FIG. 3 are numbered to show the relative heights and levels of corresponding atoms in the diamond lattice cell. Links or logical axes of connection between the nodes of FIG. 2 are represented in FIG. 3 as arrows pointing towards nodes positioned at higher layers. The arrows between each respective node represent a horizontal and vertical link. For instance, the arrow between a pair of nodes labeled 3 and 4 represent a link horizontally and vertically to a node in the level 4, which is directly above a level 0 node and the level 0 node of the next set of levels.

The 3D-4N mesh of the present invention is derived from the rectilinear array of FIG. 3 by reducing the internode spacing and offsetting alternate layers in the x and y directions, allowing contacts on overlapping horizontal surfaces to effect communications in the x direction at the level 1/2 and level 3/0 boundaries, and in the y direction at the level 0/1 and level 2/3 boundaries.

Figure 4A:
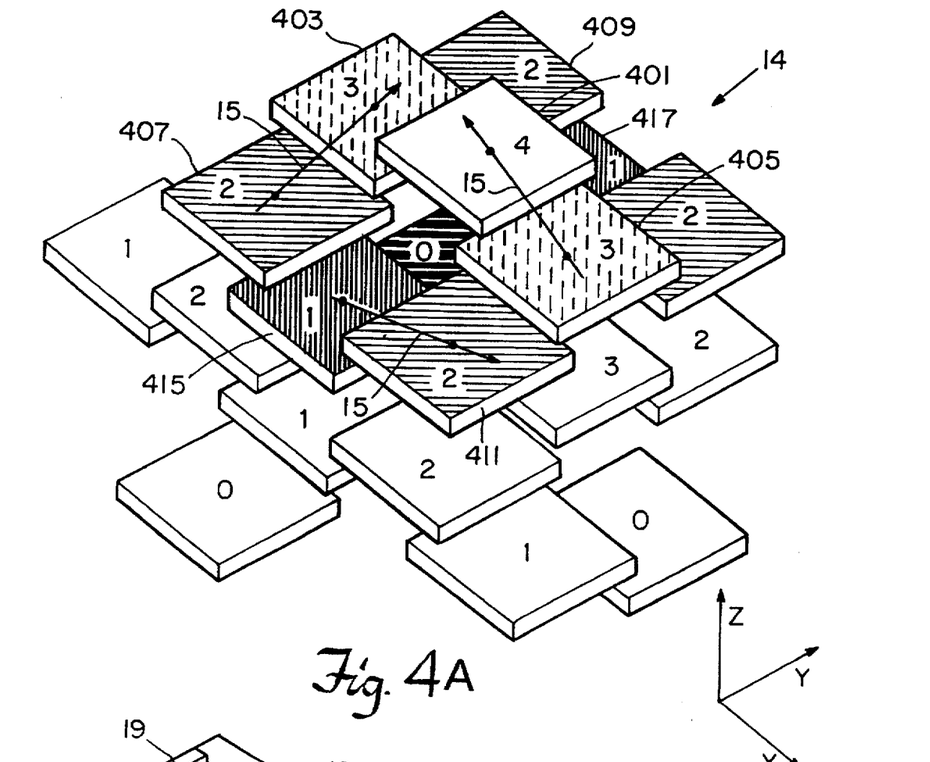
FIG. 4a shows an exploded view of the 3D tetrahedral interconnect with four connector sets at each node to connect to four neighbors (4N) according to the first embodiment of the invention.
Figures 5A, 5B:
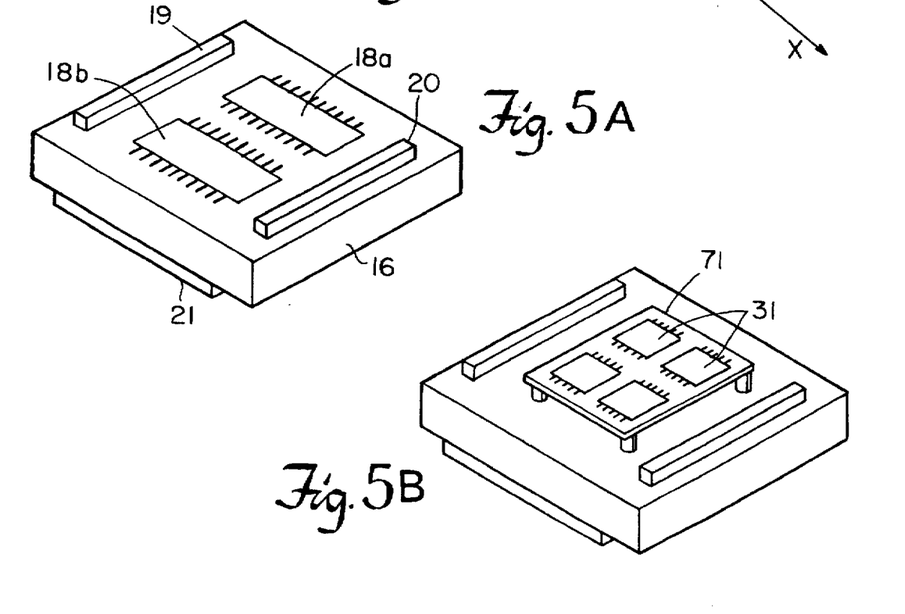
FIGS. 5a and 5b show detailed views of modules embodied in the first embodiment 3D-4N mesh.

FIG. 4a shows the 3D-4N mesh 14 having five levels of modules that correspond to the tetrahedral lattice in FIG. 2 and to the rectilinear array of FIG. 3. The 3D-4N tetrahedral interconnect includes a plurality of flat surfaced modules, substrates or nodes 403–417 which each support respective circuits 18a, 18b (FIG. 5a). The lowest substrate level of mesh 14 is represented by a level 0. The next highest substrate level is represented by level 1, then level 2, then level 3, and the highest level is represented by a level 4.

The modules 403–417 are positioned in the mesh 14 so that there is an overlap along each of the plurality of substrates at levels 0–4. Vertical connectors and flat substrates are used to create the 3D-4N tetrahedral interconnect 14. The substrates overlap one another horizontally to allow connector mating. This is possible because only two of the four edges on each side of a substrate are used for connection, allowing uniformly sized substrates to be connected vertically with horizontal overlap but without horizontal interference. The result is a 3D-4N mesh that spirals up from the bottom level 0 to the top level 4.

The mesh is configured such that adjacent substrates are rotated in connector orientation, preferably about 90°, relative to each other. Thus, communication from any one substrate is generated in four different directions, logical axes of connection. For example, a module designated as a level 1 could vertically communicate data upward to two substrates designated as a level 2 and vertically communicate data downward to two substrates designated as level 0.

Three example logical axes of interconnection are illustrated at 15 in FIG. 4a. These axes correspond to the links of FIG. 3, with arrows pointing upwardly and to the links of FIG. 2. Corresponding nodes of FIGS. 2, 3 and 4a are indicated by like two-digit numbers preceded by figure number. For example, node 201 in FIG. 2 corresponds to node 301 in FIG. 3 and node 401 in FIG. 4a. It can be seen from the figures that node 401 connects downardly in the x direction. It would also connect upwardly in the y direction with substrates not shown. The adjacent substrates 403 and 405 on the lower level 3 can connect downwardly in the y direction to substrates 407, 409 and 411, 413, respectively, and upwardly in the x direction. The level 2 substrates then connect downwardly in the x direction to, for example, modules 415 and 417. Finally, the spiral is complete with connections downwardly in the y direction to module 419.

It can be seen that, although vertical connectors are used yielding a single direction or axis of physical connection, the logical axes of connection are not along the z axes of the figures. For example, the logical connections from substrate 405 are in the (z, −x), (z, x), (−z, y) and (−z, −y) directions. The axes of connection in the adjacent levels, both levels 2 and 4, are in the (−z, x), (−z, −x), (z, −y) and (z, y) directions. From the above listings, it can be seen that adjacent modules have connections in opposite directions along the same axes. For example, the (−z, x) direction of level 2 modules is directly opposite to the (z, −x) direction of level 3 and so on. As discussed below, there are two orientations of modules characterized by the directions of connection.

Within the mesh of modules are unoccupied spaces that form a plurality of serpentine channels 25 that convey cooling fluid throughout the mesh. As fluid is forced vertically through the channels, a turbulent flow of air is created within the mesh. The turbulent air flows through the many cross-over passages to evenly cool all heat dissipating substrates 16 within the mesh 14.

The plurality of air channels can be closed to any degree to permit the mesh 14 to be consolidated into a denser interconnection if desired. Consolidation is done by moving the substrates closer to each other within each level, thus increasing the overlap between levels. A dense interconnection is desirable for attaining a faster and more efficient computer network. The 3D-4N mesh of the present invention has the capability to be indefinitely dense, but such a structure would have limited cooling capability.

The diamond lattice 3D-4N network 14 has an isotropic topology, which means that any logical subtree observed from any port of any substrate in an infinite network is isomorphic (substantially identical) to all other subtrees observed from that or any other substrate in the same network.

A further characteristic of this diamond lattice 3D-4N network is the mechanical homogeneity of the assembly where all substrates are mechanically identical at their interfaces. Thus, any node may be placed in any position within the network and maintain the mechanical integrity of the network. Although the nodes are homogeneous they may be merely mechanically compatible and perform different logical functions.

Figure 4B:
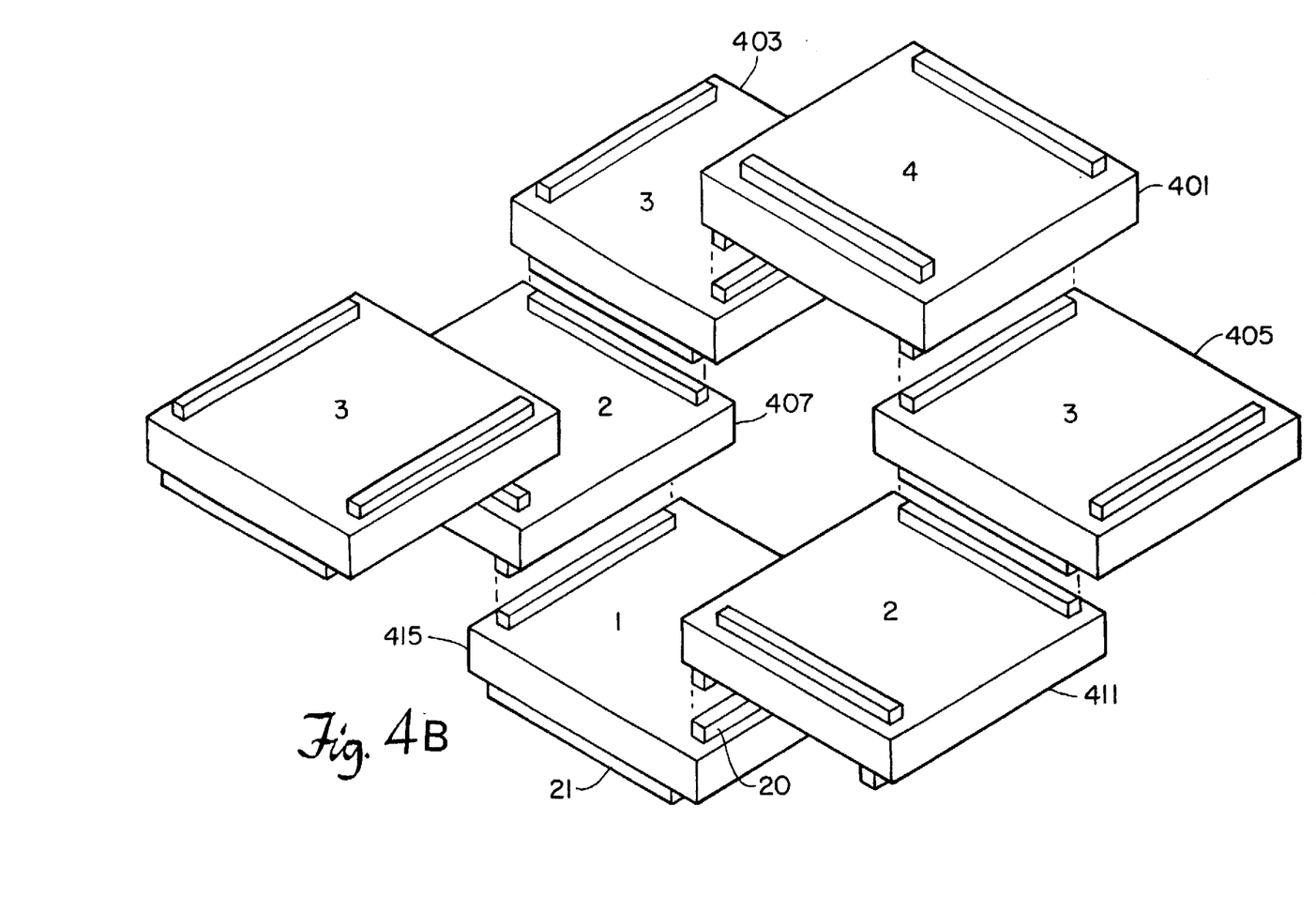
FIG. 4b shows interconnection of several of the modules of FIG. 4a with connectors illustrated.

FIGS. 4b shows a more detailed view of the modules 16 within the 3D-4N mesh of FIG. 4a. Each module includes circuits 18 and connector sets such as sockets 20 and pins 21. The sockets 20 are placed along opposite sides of each flat surfaced substrate for joining modules above. Pins 21 are placed underneath each of the flat surfaced substrates at opposite sides for connecting modules below. The pins and sockets of each module are complementary to the sockets and pins of each adjacent modules. Thus, the plurality of substrates are joined together through respective sockets and pins.

FIG. 4b shows modules each communicating with adjacent modules via their respective connector sets. For example, a module designated as level 2 communicates with the circuits of modules designated as levels 1 and level 3. This configuration allows information from modules to propagate in four directions, logical axes.

Each module is connected to its neighbors only in the vertical dimension along the physical axis of connection, meaning that individual boards may be removed from, or added to, the top of the machine in the fashion of bricks. At each step of assembly or disassembly, the mating or unmating force of only half of a single board's connectors must be applied, and alignment need only be accomplished on the scale of a single node's width.

The mesh of the present invention obviates the problem associated with the 6-neighbor Cartesian three-dimensional system (3D-6N) of FIG. 1, which is built from very large circuit boards stacked atop one another via a number of connectors with a total of thousands of pins. To repair an interior fault, a mechanical access operation must take place which usually means splitting the entire machine along a two-dimensional plane intersecting the defective part.

FIG. 5a shows integrated circuits 18 and 19 placed on a top surface a platform 72, such as a circuit board, of a module 16. The circuits, such as microprocessors, allow each node to process data and communicate with other circuits on adjacent nodes through their respective connector sets. For example, chip 18a may provide the inter-module communications control and switching circuitry while chip 18b provides local node processing.

Each connector 19, 20, 21 provides a point of intermodule connection along the same direction 73, the axis of physical connection. Each connector 19, 20, 21 provides a different logical axis of connection, however, to other modules in the lattice. This feature provides certain advantages over the prior art device illustrated in FIG. 1, for example. In this device, directions of physical connection and logical axes of connection are in a ratio of 1 to 2. That is, for interior units, there are three orthogonal directions of physical connection corresponding to the three pairs of opposed sides of the cube. Six logical axes of connection exist since each cube communicates with six other cubes. A single direction of connection enables easy attachment and removal of modules to the lattice since disconnection is only in a single direction.

In an embodiment with minimal horizontal overlap, only one quarter of the three dimensional volume is occupied. This leaves a vertical space for auxiliary boards such as "daughterboards" to be plugged atop each substrate. Also, this space could be used for distributed peripherals such as disk drives. FIG. 5b shows a daughterboard 27 standing over the substrate. On top of the daughterboard are four integrated circuits 31. The multi-chip module allows each node to increase its communication and processing capabilities.

Figure 6A:
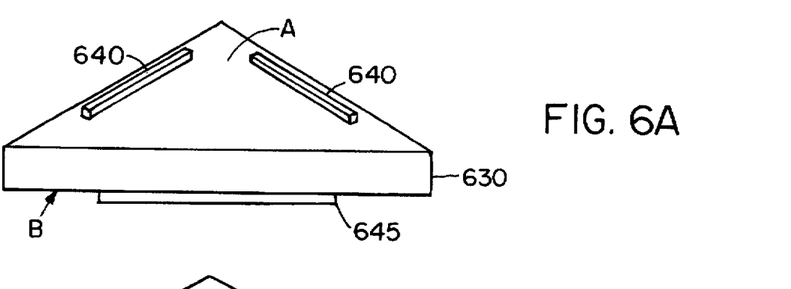
FIGS. 6a and 6b shows alternative configuration of the modules for the 3D-4N mesh.

FIG. 6a shows an alternative module configuration. Side A of a triangular platform 630 has two connectors 640. Side B has a single connector 645. Mating of two of these modules by connecting their respective connectors 645 to each other results in a module-pair have two up-connectors and two down-connectors available. This module pair then has the effective connectivity of the module 16 of FIG. 5a, enabling connection into the tetrahedral lattice. It will be appreciated that this embodiment either must utilize neuter, i.e., not male or female, connectors that can connect to each other or the lattice must include two types of modules, half having all male connectors and the others having all female connectors, for example.

Figure 6B:
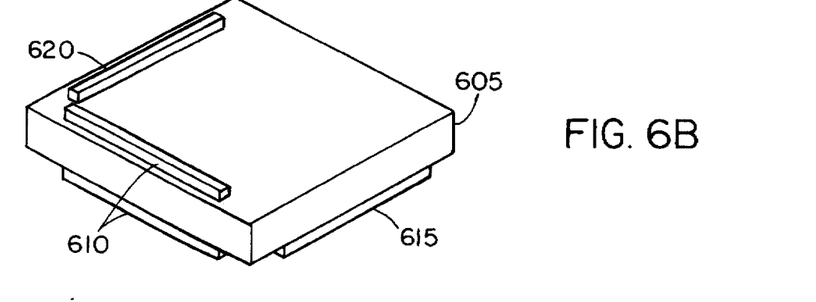

FIG. 6b shows an still another alternative module configuration, incorporating a pass-through connector set 610. Here, essentially three unique connector 610, 615, 620 are positioned on a module platform 605. The pass-through connector 610, however, enables connection from either the top or bottom face of the module 605 to the same port. Again, when this module 605 is paired to another similar module by connecting up-connector 620 to the down-connector 615 of the other module, for example, the resulting module pair has two up-connectors and two down-connectors available, yielding an effective connectivity of the module 16 of FIG. 5a.

The plurality of modules facilitate communication in the mesh through the use of cross-point switches and registers which are supported by each respective module. The cross-point switches and registers provide a parallel connection among the plurality of modules.

The hardware complexity of the 3D-4N interconnect 14 is characterized, in part, by the cross point switches which have a high performance switching node of C channels, each of width W, that grows roughly with $O(C^2W)$. Networks such as the 3D-6N neighbor mesh utilize 6 neighbor switches, with one channel for each direction of travel along each orthogonal dimension. By utilizing a 4 neighbor topology instead of 6, the tetrahedral interconnect 14 realizes a reduction of switch complexity. Keeping the number of communications pins per node (C W) constant, we have $$C_4 = \frac{2}{3} C_6 \text{ and } W_4 = \frac{3}{2} W_6$$

The 4 and 6 sub-units denote 4 neighbor and 6 neighbor networks, respectively. This yields a switch complexity for the 4 neighbor switch which is ⅔ (66%) as large as that of the total pin equivalent 6 neighbor switch. If an additional channel is used for communications to the local node, then a 5 neighbor is compared to a 7 neighbor switch, and the savings are somewhat reduced to 5/7 (75%), but are still substantial.

In a mesh, a significant portion of the signal propagation delay of a cross-point switch drops linearly with a reduction of its capacitive load. This load corresponds roughly to the number of switched channels. Thus, there is a significant decrease of individual switching node latency (or, equivalently, an increase in network clock frequency) in 4 neighbor switches versus 6 neighbor switches due to the lower number of channels.

The 3D-4N tetrahedral interconnect 14 as shown in FIG. 4a is isotropic. An anisotropic 3D-4N network may be constructed by removing two of the six channels connecting each node of a 3D 6N mesh. The configuration would appear as in FIG. 1, with each module having connections on its top and bottom surfaces as well as two opposite lateral faces. The lateral connections would alternate in X and Y directions with successive vertical levels.

Unfortunately, if channel widths are uniform, such a network has unequal bandwidth along the three directions of travel, making intelligent routing and load distribution a complex matter. In order to balance network load, it becomes necessary to relocate communicating processes further apart along the directions of high network bandwidth and closer together along the directions of low network bandwidth. Alternatively, one may vary the number of pins dedicated (i.e., the width) per channel in each dimension. Overall, the anisotropic network is inferior to an isotropic network of equivalent channel and pin count.

As discussed above relative to FIG. 4a, adjacent substrates connect in opposite directions. It is seen that two node orientations are present, as distinguished by the X, Y and Z (depth) offsets of their connections to neighboring nodes:

TABLE 1

Connection Offset to Neighbor

| Orientation 0 | | | Orientation 1 | | |
|---|---|---|---|---|---|
| X | Y | Z | X | Y | Z |
| +1 | 0 | −1 | −1 | 0 | +1 |
| −1 | 0 | −1 | +1 | 0 | +1 |
| 0 | +1 | +1 | 0 | −1 | −1 |
| 0 | −1 | +1 | 0 | +1 | −1 |

Node orientations of the present invention are labeled as '0' and '1'. Note that the available link offsets of each node orientation are negative of one another, i.e., orientation '0' nodes only connect to orientation '1' nodes, and vice versa.

Each node-to-node connection involves an increment or decrement in either the X or Y directions (but not both) and always an increment or decrement in the Z (depth) direction.

In the Cartesian 3D-6N network of FIG. 1, messages usually travel along "Manhattan" routes, with each step being made in the direction of one of the orthogonal axes. The tetrahedral interconnect 14, despite being a three-dimensional topology, has 4 non-orthogonal directions of travel, corresponding to the 4 link offsets which are shown in Table 1. Thus, it is difficult to describe the node coordinates and routing directions of the tetrahedral interconnect in a three coordinate system.

A simplified addressing scheme is obtained by utilizing a 4 coordinate or 4-dimensional addressing system. In the 4-D addressing system, the direction of each link axis in the diamond lattice corresponds to one of the 4 dimensions.

As mentioned above, there are two node orientations in the tetrahedral interconnect. At any node, a message may only travel on any one of the 4 dimensions in a single direction. Having traveled one link in that direction, the message arrives at a node of the opposite orientation, and may not continue along that same dimension in the same direction. Instead, travel must proceed in the opposite direction, along any of the 4 dimensions.

For the sake of uniformity, traveling from any orientation '0' node to any orientation '1' node has an offset value of +1, while traveling from any orientation '1' node to any orientation '0' node has an offset value of −1. The mapping of 3-D position offsets [X,Y,Z] to 4-D address offsets [A,B,C,D] is indicated in Table 2.

TABLE 2

| 3-D Position | | | 4-D Position | | | |
|---|---|---|---|---|---|---|
| X | Y | Z | A | B | C | D |
| Offset to Neighbor: Orientation 0 Node | | | | | | |
| +1 | 0 | −1 | +1 | 0 | 0 | 0 |
| −1 | 0 | −1 | 0 | +1 | 0 | 0 |
| 0 | +1 | +1 | 0 | 0 | +1 | 0 |
| 0 | −1 | +1 | 0 | 0 | 0 | +1 |
| Offset to Neighbor: Orientation 1 Node | | | | | | |
| −1 | 0 | +1 | −1 | 0 | 0 | 0 |
| +1 | 0 | +1 | 0 | −1 | 0 | 0 |
| 0 | −1 | −1 | 0 | 0 | −1 | 0 |
| 0 | +1 | −1 | 0 | 0 | 0 | −1 |

The center network node is labeled [0,0,0,0] and arbitrarily declared to be orientation '0'. A message may travel from the center node [0,0,0,0] to either [1,0,0,0], [0,1,0,0], [0,0,1,0] or [0,0,0,1]. Once at this second node (an orientation '1'), the direction of travel may be on any of the 4 dimensions, but is restricted to be in the opposite direction, i.e., an address increment of −1. For example, if the second node was [1,0,0,0], the message may now travel to a third node at either [0,0,0,0], [1,−1,0,0], [1,0,−1,0] or [1,0,0,−1].

Since continued travel must invoke alternating address coordinate increments of +1 and −1, the sum of the 4D address coordinates is constrained to be 0 on all orientation '0' nodes (those being an even number of hops away from the central node), and +1 on all orientation '1' nodes (those having an odd number of hops away from the center). Thus, the coordinate sum is exactly equal to the node orientation, and is also equal to the parity of the routing distance from the center.

By induction, one can show that any address whose 4 coordinates sum to either 0 or 1 is a valid node address. The sum-to-0 or sum-to-1 constraints correspond to forcing the node coordinates to lie on one of two 4-dimensional hyperplanes, with each hyperplane corresponding to the orientation of the node. Since links only connect orientation '0' to orientation '1' nodes (and vice versa), messages cannot travel directly within each hyperplane. Instead, they must zig-zag between the two.

Since the present invention uses a 4-D address, there may be concern as to how well defined the addressing system is. The 4-D address space is well defined if:

1. No two nodes may be assigned the same address.
2. No two addresses may be assigned the same node.

Since we know that physical node locations in 3-space are unique, verifying these two properties equates to demonstrating that the mapping from 3-D locations to 4-D addresses is one-to-one.

If we label a center node [0,0,0,0], and use the offsets indicated in the table above, a node's 3-D position ([X,Y,Z]) may be calculated from its 4-D address ([A,B,C,D]) as follows:

| X | A | +1 | −1 | 0 | 0 |
|---|---|---|---|---|---|
| Y | B | 0 | 0 | +1 | −1 |
| Z = | C | −1 | −1 | +1 | +1 |
| T | D | +1 | +1 | +1 | +1 |

Note that a fourth quantity T has been added to the 3-D physical coordinate which indicates the orientation (either 0 or 1) of the node, and is given by the sum of its 4-D address.

From the above equation, a 4-D address [A,B,C,D,] is seen to map to only one 3-D location and orientation [X,Y,Z,T].

The right hand matrix has a unique inverse, so that:

| A |   | X | +½ | 0 | −¼ | +¼ |
|---|---|---|----|---|----|----|
| B |   | Y | −½ | 0 | −¼ | +¼ |
| C | = | Z | 0 | +½ | +¼ | +¼ |
| D |   | T | 0 | −½ | +¼ | +¼ |

Thus, a given 3-D location (and orientation, which is necessarily constrained to have only one value) maps to only one 4-D address. The mapping is therefore one-to-one.

The 4-dimensional addressing scheme allows routing within the tetrahedral interconnect in a Manhattan-style fashion, albeit, with 3 out of every 4 streets (links) missing. The missing links limit the number of available routes, but the computation of route-distance is still the same. One simply sums the address differences over all 4 coordinates to obtain the minimum number of links that must be traversed.

At each step along a minimal distance route, a choice of at most 3 directions of travel is possible (if one is not at the destination, the difference between the current and desired address can have at most 3 non-zero coordinates of the same sign). If one is at an orientation '0' node, the next hop will add 1 to one of the dimensions, thus one has the choice of any of the dimensions whose target coordinate is greater than the corresponding coordinate of the current node. For some minimal routes (i.e. [0,0,0,0] to [0,0,10,−10]) there is no choice whatsoever.

Deadlock-free adaptive routing schemes that work for Cartesian 3D-6N meshes also work for the 3D-4N tetrahedral interconnect, provided that the 4-D addressing scheme is used (which provide Manhattan routing) and that each "missing" link in 4-D is marked as unavailable to the router. The 3D-4N tetrahedral interconnect has straight through channels which only last a single "hop" before a turn is required. The new deadlock-free routing scheme of the present invention significantly improves performance and load balancing in the tetrahedral interconnect.

One example of such a routing scheme involves the grouping of pairs of links as the means to route from one node of a given type to another node of the same type. Let us assume arbitrarily that the beginning node is in orientation 1, and that a route to another orientation 1 node is required. This means that an even number of hops must be used, i.e. first subtract 1, and then add 1 to pairs of address coordinates until the destination is reached (if the 4-D address has 4 bins filled with varying numbers of tokens, this corresponds to removing a token from one bin and depositing it in another).

At any node, the choice of which pair of coordinates to decrement and then increment involves a choice of 1 of 12 possibilities. This corresponds to 2 polarities of double-hop travel along 6 different unsigned directions. This is not to suggest a 6-dimensional addressing scheme, which is easily shown to be not well defined (i.e., there are two distinct paths between two nodes with different 6-D address offsets). The 6 directions are more useful for direct routing than the 4 Manhattan address dimensions because travel may continue in the same direction for successive double-hops. Thus, a routing strategy that utilizes strict ordering of travel directions to avoid deadlock (and adaptive modifications of such) can now be used directly, albeit, with six considered directions of travel (instead of the usual three) at each node. In a non-adaptive system, at each intermediate node, one would route as far as possible along each of the six double-hop directions until the destination was reached.

Since each link in the double-hop routing scheme is used for three different signed directions of travel, a buffering of three words in each signed link direction is required.

Figure 7:
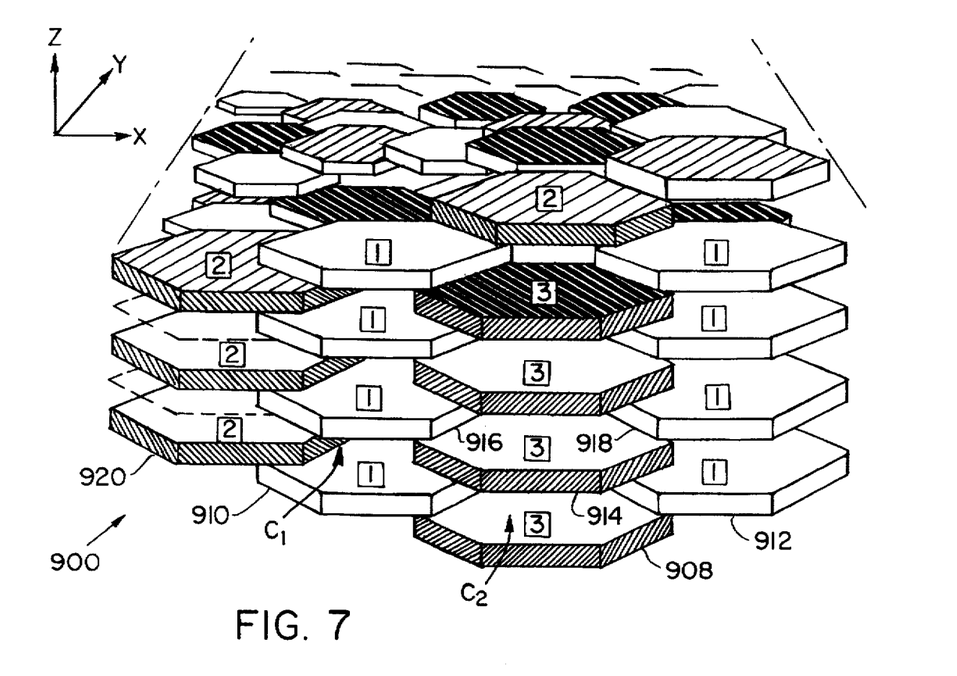
FIG. 7 shows the three-dimensional hexahedral interconnect according to a second embodiment of the present invention.

FIG. 7 shows still another scalable, three-dimensional interconnect or mesh 900 constructed according to the principles of the present invention. Here, each node, module or substrate, see 908—920, connects to six adjacent neighbors yielding a 3D-6N mesh. The modules 908-920 are depicted as generally flat with hexagonal horizontal cross-sections. In the specific example illustrated, the mesh 900 is approximately 12 levels high, although larger or smaller meshes are achievable by simply adding or removing modules.

The mesh 900 has only three uniquely configured levels, i.e., the mesh repeats every third level. Modules of the same level are indicated by similar shading and the numbers 1, 2, or 3 on the modules indicate the three repeated levels. Inter-module connections are only made between adjacent levels. For example, each level-1 module directly connects upwardly to level-2 modules. The connection sites are vertically overlapping edges of the modules in adjacent levels, such as overlapping edge $C_1$, providing an exemplary connection site between a level-1 module 910 and a level-2 module 920. Another overlapping edge $C_2$ provides a connection site between a level-1 module 910 and a level-3 module 908. Note, connection sites between level-2 modules and level-3 modules are generally hidden in the FIG. 7 view.

Figure 8:
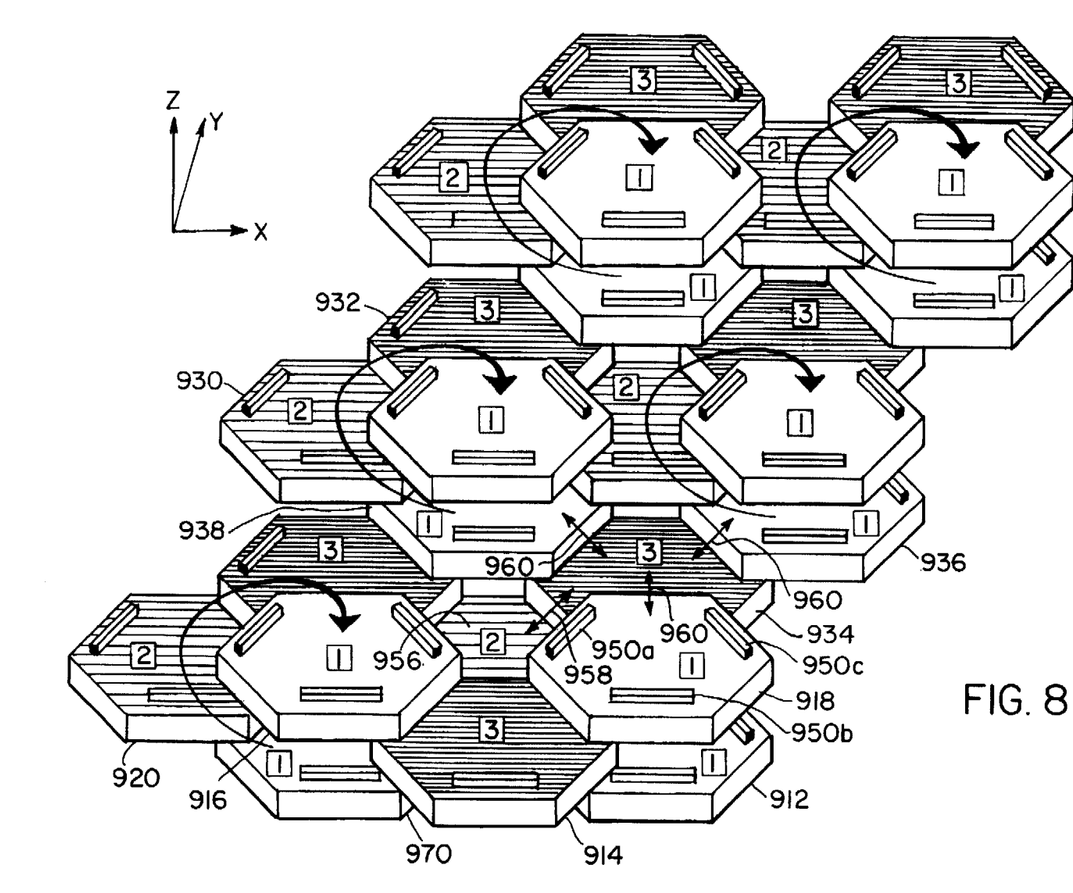
FIG. 8 shows an exemplary portion of the inventive hexahedral interconnect of FIG. 7.

FIG. 8 shows an exemplary array of the modules extracted from the mesh to more clearly illustrate intermodule connectivity. A few modules in each of FIGS. 7 and 8 have been referenced with the same reference numerals to enable reader orientation. Each module is provided with three vertically extending female connectors, see 950a, 950b, and 950c for example, which mate with male connectors on the underside of each module (not shown in this view). This gives each module six logical axes of connection, i.e., connections to six other modules. For example, module 934 connects downwardly to three modules and upwardly to three. The inter-module connections of module 934 to modules 918, 936, 938 are in the following directions (0, −y, +z), (+x, +y, +z), and (−x, +y, +z), while connections to modules of a lower level are in the following directions: (0, +y, −z), (x, −y, −z), and (−x, −y, −z).

The female connectors 950a, 950b, and 950c are positioned around the periphery on alternate edges of the module. As a result, only vertically extending connectors are required to provide the inter-module connection. Therefore, as in the first embodiment, each module connects only along a single direction or physical axis of connection.

The resulting mesh is hexahedral, i.e., each module connects to six other modules, and is also isotropic. Another characteristic is the mechanical homogeneity of the modules. Thus, each module can be placed at any position within the mesh while maintaining the mechanical integrity of the mesh. Pairs of connected modules, on adjacent levels, have identical connector layouts but are rotated 60° with respect to the connector layout relative to each other, see modules 930 and 932, for example. Since the connectors 950 a,b,c on a given module are positioned at 120 degree increments, the module orientation repeats every other level. Therefore, the modules of the lattice take on only two orientations.

The 3-dimensional mesh of modules have unoccupied spaces 956 that form serpentine channels through the mesh. Depending upon the cooling requirements of each module, a cooling fluid such as air or a liquid is forced throughout these channels to carry off excess heat generated by the modules. If desired for a particular implementation, the air channels can be closed to varying degrees by consolidating the mesh with a denser interconnection. By moving the connectors axially toward the center of each module, a higher degree of horizontal overlap in each level can be achieved which allows faster communication between the modules by shortening the physical length of the intermodule connections. But, minimal overlap favors the use of daughterboards.

Figure 9A:
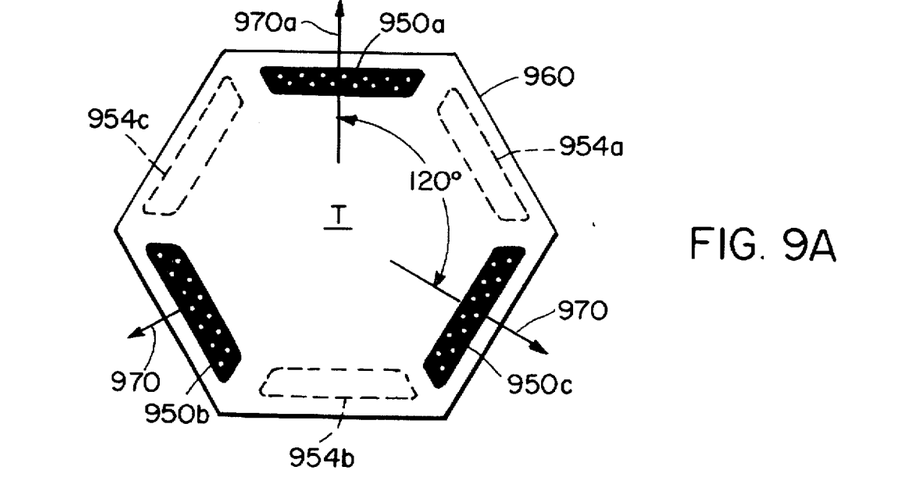
FIGS. 9a, 9b, and 9c show an exemplary second embodiment module in top plan, side plan, and bottom plan views, respectively.
Figure 9B:
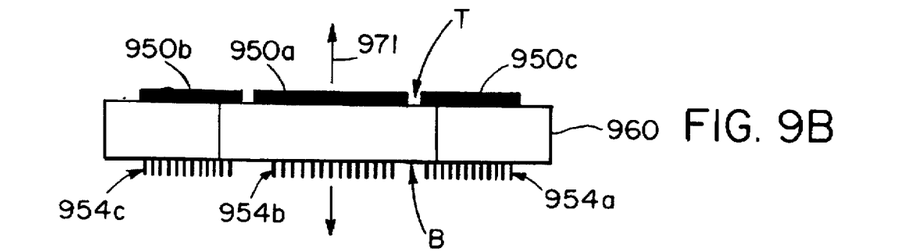
Figure 9C:
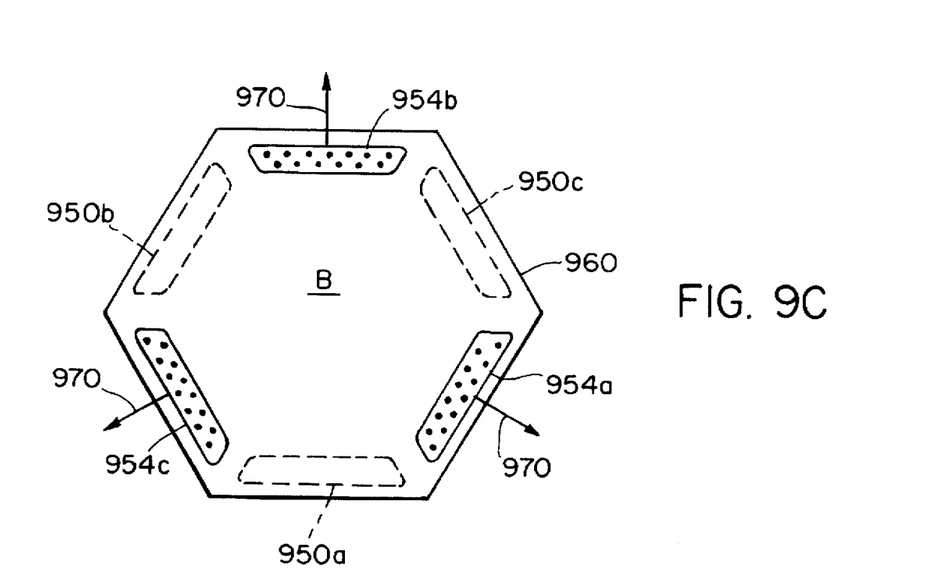

Referring to FIGS. 9a, 9b, and 9c, each module, node or substrate comprises a platform 960 which supports the six connectors. This platform 960 is ideally a circuit board on which a plurality of integrated circuits are located. Alternatively, in possibly more sophisticated embodiments, the platform 960 can be an actual silicon substrate. In either case, the electronic circuits comprise communication circuits for communicating data to other modules through the connectors. Further, the circuits can include independent processors for performing computations on the data and memory devices, which are accessed by the processors. FIG. 11a is a top T plan view of an exemplary module in which female connectors 950. a,b,c, such as a RS-232 connectors, are spaced at 120° increments on alternative edges of the hexagonal platform 960. Edges, which do not have upward extending female connectors, have downward extending male connectors 954 a,b,c as best shown in FIG. 11c, illustrating a bottom B plan view of the exemplary module. Each of the connectors 950 a,b,c and 954 a,b,c provide a different logical axis of connection 970 to other modules. But, as shown in FIG. 11b, only a single axis of physical connection 971 is present.

Figures 10, 11:
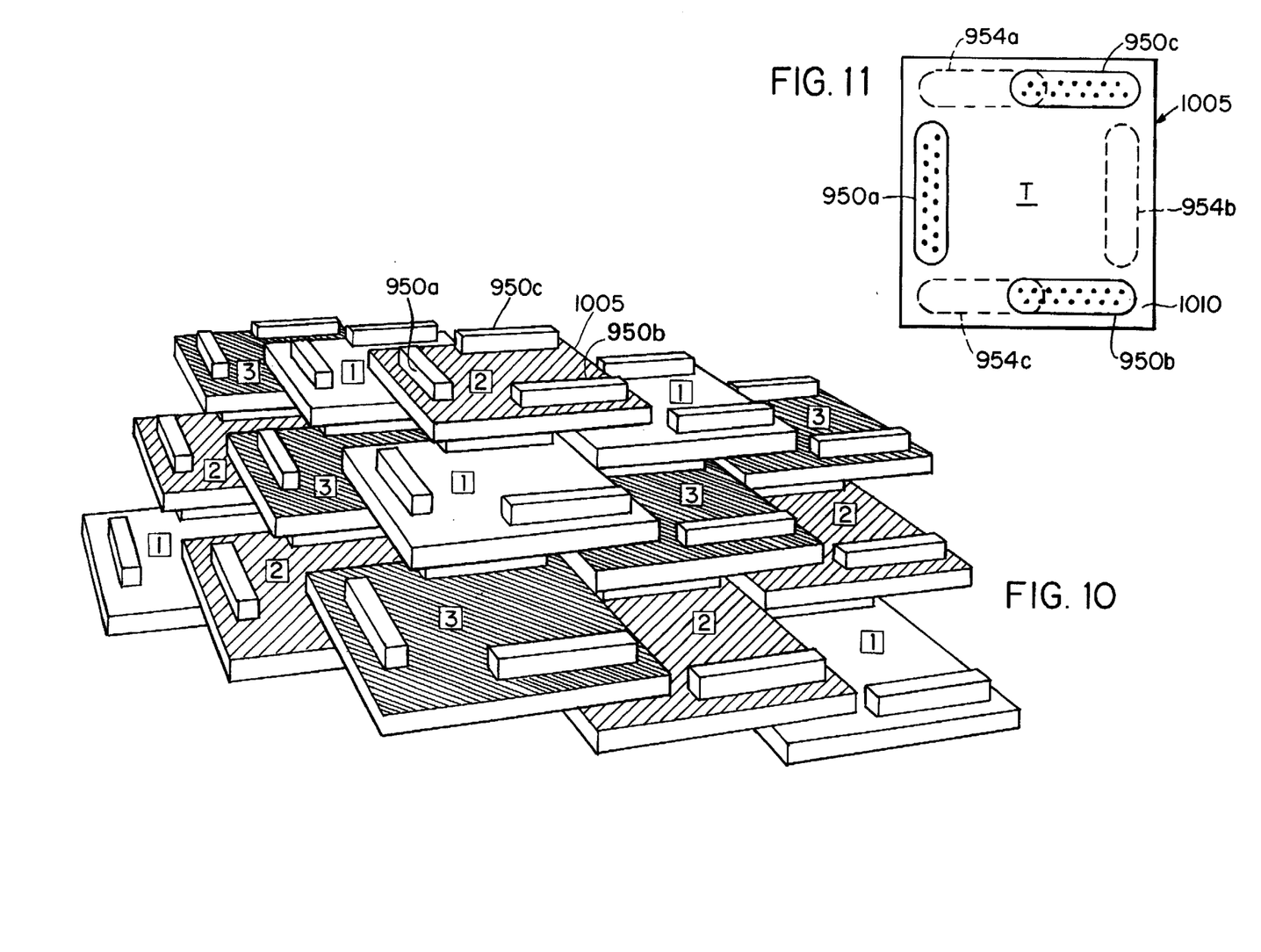
FIG. 10 shows the three-dimensional hexahedral interconnect implementing an alternative shape, rectangular, of the module.
FIG. 11 shows the rectangular module.

Those skilled in the art will recognize that the physical shape of the module platforms or the particular connector layout on the platforms is not critical to the invention. For example, rectangular modules 1005 can be implemented in the mesh as shown in. FIG. 10. Here, as in FIGS. 7 and 8, the levels of the modules are indicated by numbers placed on the modules. The logical connectivity of this implementation remains the same as hexagonal modules shown in FIGS. 7 and 8. These rectangular modules include the same up-connectors 950 a,b,c and down-connectors 954 a,b,c as in the hexagonal modules. As better illustrated in FIG. 11, up-connectors 950 a,b,c and down-connectors 954 a,b,c are alternatingly spaced around the edge of a rectangular platform 1010 of the module 1005.

The inherent advantage of the present invention lies in the fact that it has the same logical interconnectivity as the cubic model of FIG. 1. One disadvantage of the first embodiment of FIG. 4a is that the diamond lattice is not a convenient lattice to use for mesh calculations. Presently, such calculations are most commonly formulated for a cubic lattice. If the cubic lattice of FIG. 1, however, is rotated to stand on one of its corners, its logical interconnectivity will match that of this third embodiment. As a result, this third embodiment achieves the simplicity of construction of the first embodiment while being logically compatible with older cubic configurations.

While the invention has been particularly shown and described in conjunction with a preferred embodiment thereof, it will be understood that many alternatives, modifications, and variations will be apparent to those skilled in the art without departing from the spirit and scope of the invention as defined by the appended claims. For example, though connectors are shown mounted to preferred vertical and horizontal surfaces, they may, for example, be mounted on beveled edges such that they are directed at an angle. The terms vertical and horizontal are simply relative terms and do not limit the orientation of the array.

We claim:

1. A three-dimensional electronic circuit assembly comprising: a plurality of data processing modules supporting respective circuits, each module having at least three sets of connectors along fewer than six flat surfaces thereof for joining the circuits on the modules to adjacent modules, adjacent modules being oriented relative to each other such that adjacent modules interconnect in a three-dimensional lattice of stacked levels and wherein the connectors of each one of the modules connect along the same direction and the lattice is isomorphic with a diamond lattice when the modules are correlated to carbon atoms of the diamond lattice.

2. An assembly as claimed in claim 1, wherein the levels form a repeating lattice, repeating only every fourth level.

3. A computer as claimed in claim 1, wherein the grid pattern of each of said levels defines two perpendicular axes in the plane of the level, and the grid patterns of consecutive levels are offset with respect to each other along one of said two perpendicular axes by one half the distance between centers of adjacent modules.

4. An assembly as claimed in claim 1, wherein modules of each of the levels are organized in a grid pattern and the grid pattern of each of the levels defines two perpendicular axes in the plane of the levels, and in every series of three consecutive levels, a first level and a second level are offset with respect to each other along a first one of the two perpendicular axes and the second level and a third level are offset with respect to each other along a second one of the two perpendicular axes.

5. A computer as claimed in claim 4, wherein the first level and the second level are offset by one half the distance between centers of adjacent modules along the first one of the axes.

6. A computer as claimed in claim 5, wherein the second level and the third level are offset by one half the distance between centers of adjacent modules along the second one of the axes.

7. An assembly as claimed in claim 1, wherein the modules are addressed within the lattice by a four element vector.

8. An assembly as claimed claim 1, wherein each of the modules of any given level only directly connects to exchange data with other modules of a corresponding next higher level and a corresponding next lower level.

9. An assembly as claimed in claim 8, wherein each of the modules of any given level is adapted to only directly connect to exchange data with two other modules of a corresponding next higher level and two other modules of a corresponding next lower level.

10. An assembly as claimed in claim 1, wherein the three-dimensional lattice is isotropic.

11. An assembly as claimed in claim 1, further comprising auxiliary circuit boards mounted to the modules.

12. An assembly as claimed in claim 1, further comprising a two-phase clock input for controlling communications between the modules, modules of successive levels operating on opposite phases of the clock.

13. An assembly as claimed in claim 1, wherein the modules are spaced within levels such that serpentine vertical flow paths exist between the modules.

14. An assembly as claimed in claim 1, wherein each of the modules is in one of two orientations, each orientation having different effective directions of interconnection, each module being connected only to modules of the opposite orientation.

15. An assembly as claimed in claim 1, wherein each module has a first face and a second face, which is opposed to the first face, the sets of connectors being located on the first and second faces such that the connectors on the first face are rotated with respect to the connectors on the second face.

16. A three-dimensional electronic circuit assembly comprising: a plurality of data processing modules supporting respective circuits, each module having at least three sets of connectors along fewer than six flat surfaces thereof for joining the circuits on the modules to adjacent modules, adjacent modules being oriented relative to each other such that adjacent modules interconnect in a three-dimensional lattice of stacked levels and wherein the connectors of each one of the modules connect along the same direction and the lattice is hexahedral.

17. An assembly as claimed in claim 16, wherein the modules of any given level have the same orientation relative to each other.

18. An assembly as claimed in claim 17, wherein the modules of consecutive levels have opposite orientations relative to each other.

19. An assembly as claimed in claim 18, wherein modules of consecutive levels are rotated ninety degrees around an axis orthogonal to the levels relative to each other.

20. An assembly as claimed in claim 16, wherein modules of consecutive levels are rotated sixty degrees around an axis orthogonal to the levels relative to each other.

21. An assembly as claimed in claim 7, wherein each of the modules of any given level is adapted to only directly connect to exchange data with three other modules of a corresponding next higher level and three other modules of a corresponding next lower level.

22. An assembly as claimed in claim 21, wherein the lattice has the logical interconnectivity of a cubic lattice.

23. An assembly as claimed in claim 7, wherein each of the modules of any given level is adapted to directly connect to exchange data with three other modules of a corresponding next higher level and three other modules of a corresponding next lower level.

24. An assembly as claimed in claim 23 wherein the three-dimensional lattice is isotropic.

25. As assembly as claimed in claim 23 wherein the lattice has the logical interconnectivity of a cubic lattice.

26. A method of providing a three-dimensional electronic circuit assembly, comprising:

providing a plurality of modules for performing data processing operations;

arranging the modules in a three-dimensional isotropic lattice;

arranging the modules in stacked levels;

providing each of the modules with connectors that connect along the same direction; and connecting each of the modules in the interior of the lattice of a given level to other modules of a corresponding next higher level and other modules of a corresponding next lower level to form a lattice that is isomorphic with a diamond lattice.

27. A method as claimed in claim 26, further comprising rotating modules of consecutive levels 90 degrees around an axis orthogonal to the levels relative to each other.

28. A method as claimed in claim 26, further comprising arranging the levels to form a repeating lattice repeating only every fourth level.

29. A method as claimed in claim 26, further comprising arranging the modules of each of the levels into a grid pattern.

30. A method as claimed in claim 29, further comprising offsetting the grid patterns of adjacent levels with respect to each other along one of two perpendicular axes defining the grid patterns by one half the distance between centers of adjacent modules.

31. A method as claimed in claim 29, further comprising, in every series of three consecutive levels, offsetting the grid patterns of a first level and a second level with respect to each other along a first one of two perpendicular axes defining the grid patterns, and offsetting the second level and a third level with respect to each other along a second one of the two perpendicular axes.

32. A method as claimed in claim 31, further comprising offsetting the first and the second levels by a distance of one half the distance between centers of adjacent modules along the first one of the axes.

33. A method as claimed in claim 32, further comprising offsetting the second and the third levels by the distance of one half of the distance between centers of adjacent modules along the second one of the axes.

34. A method of providing a three-dimensional electronic circuit assembly, comprising:

providing a plurality of modules for performing data processing operations;

arranging the modules in a three-dimensional isotropic hexahedral lattice;

arranging the modules in stacked levels;

providing each of the modules with connectors that connect along the same direction; and connecting each of the modules in the interior of the lattice of a given level to other modules of a corresponding next higher level and other modules of a corresponding next lower level.

35. A method as claimed in claim 34, further comprising rotating modules of consecutive levels 60 degrees around an axis orthogonal to the levels relative to each other.

36. An electronic circuit assembly comprising data processing modules in a three-dimensional lattice supporting respective circuits, each module having at least six possible logical axes of connection to other modules of the lattice, wherein physical connections to the other modules are made with connectors that connect along the same direction and the lattice has the logical interconnectivity of a cubic lattice.

37. An assembly as claimed in claim 36, wherein each module comprises at least four connectors for providing mechanical and electrical interconnections to other modules of the lattice, the connectors being located on opposed faces of each of the modules such that a layout of the connectors on a first face of the modules is rotated with respect to a layout of the connectors on a second face of the modules.

* * * * *

UNITED STATES PATENT AND TRADEMARK OFFICE
CERTIFICATE OF CORRECTION

| | |
|---|---|
| PATENT NO. : | 5,691,885 |
| DATED : | November 25, 1997 |
| INVENTOR(S) : | Stephen A. Ward, Gill A. Pratt, John Nguyen, John S. Pezaris, and Norman Margolus |

It is certified that error appears in the above-identified patent and that said Letters Patent is hereby corrected as shown below:

In column 15, line 23, please replace "claim 7" with --claim 16--.

In column 15, line 30, please replace "claim 7" with --claim 16.

Signed and Sealed this

Tenth Day of March, 1998

Attest:

BRUCE LEHMAN

*Attesting Officer*    *Commissioner of Patents and Trademarks*